US006583562B1

(12) United States Patent
Gubbels

(10) Patent No.: US 6,583,562 B1
(45) Date of Patent: Jun. 24, 2003

(54) METAL HALIDE LAMP WITH GAS-TIGHT SEAL

(75) Inventor: Henricus Peter Maria Gubbels, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 197 days.

(21) Appl. No.: 09/649,935

(22) Filed: Aug. 29, 2000

(30) Foreign Application Priority Data

Aug. 31, 1999 (EP) ........................................... 99202815

(51) Int. Cl.[7] ................................................ H01J 17/18
(52) U.S. Cl. ....................................... 313/625; 313/634
(58) Field of Search ................................ 313/625, 623, 313/331, 332

(56) References Cited

U.S. PATENT DOCUMENTS

| | | | | |
|---|---|---|---|---|
| 2,682,009 A | * | 6/1954 | Fraser | 313/623 |
| 2,876,377 A | * | 3/1959 | Retzer et al. | 313/623 |
| 3,515,929 A | * | 6/1970 | Kearney et al. | 313/623 |
| 3,793,615 A | * | 2/1974 | Homonnay et al. | 313/331 |
| 4,277,715 A | | 7/1981 | Claassens et al. | 313/200 |
| 4,851,733 A | * | 7/1989 | Kuus et al. | 313/331 |
| 5,424,609 A | | 6/1995 | Geven et al. | 313/623 |
| 5,455,480 A | * | 10/1995 | Bastian et al. | 313/623 |
| 6,169,366 B1 | * | 1/2001 | Niimi | 313/623 |
| 6,313,582 B1 | * | 11/2001 | Miyanaga et al. | 313/623 |

FOREIGN PATENT DOCUMENTS

| | | | |
|---|---|---|---|
| GB | 1435244 | 5/1976 | C04B/37/00 |

* cited by examiner

*Primary Examiner*—Michael H. Day
(74) *Attorney, Agent, or Firm*—Frank Keegan

(57) ABSTRACT

The invention relates to a metal halide lamp provided with a discharge vessel having a ceramic wall, which vessel encloses a discharge space in which an electrode is positioned. The discharge vessel is closed off by a plug in which a lead-through element is sealed in a gastight manner by means of a sealing ceramic. The lead-through element forms an electrical connection from the electrode inside the discharge vessel to a current supply conductor outside the vessel.

According to the invention, the lead-through element has a ceramic core which is sealed to the plug in a direct joint in a gastight manner by means of sealing ceramic. The core is provided with a metal envelope at either side of the direct joint, which envelopes are interconnected by a small metal strip.

16 Claims, 2 Drawing Sheets

METAL HALIDE LAMP WITH GAS-TIGHT SEAL

BACKGROUND OF THE INVENTION

The invention relates to a metal halide lamp provided with a discharge vessel with a ceramic wall which encloses a discharge space in which an electrode is arranged, which discharge vessel space is sealed off by means of a ceramic plug in which a lead-through element is fastened in a gastight manner by means of a sealing ceramic, said lead-through element serving to form an electrical connection between the electrode and a conductor outside the discharge vessel.

The term "ceramic wall" in the present description and claims is understood to mean a wall of metal oxide such as, for example, sapphire or densely sintered polycrystalline $Al_2O_3$ as well as of metal nitride, for example AIN.

A lamp of the kind mentioned in the opening paragraph is known from EP 0587238 =U.S. Pat. No. 5,424,609 (N14191). The lead-through element in the known lamp is built up from at least two electrically conducting parts. The lead-through element consists of an Nb rod at the area of the ceramic seal. The advantage of the use of Nb is that it is highly ductile on the one hand, while on the other hand it has a coefficient of expansion which differs only very slightly from that of the ceramic material used for the discharge vessel. A disadvantage is, however, that Nb is not resistant to halides. This implies that the lead-through element in the known lamp comprises at least a second part which can be exposed to halides during a longer period, and that the Nb must be fully screened off from the discharge space, for example in that it is coated with the sealing ceramic. A further complicating factor is that the second part which is allowed to be exposed to halides will have a coefficient of expansion which differs considerably from that of the ceramic wall material. Besides the disadvantages described above relating to the complicated construction of the known lamp, a further disadvantage is found to occur in practice in the form of an attack on the sealing ceramic by the halide present, so that after some time the Nb comes into direct contact with the halides after all and the lamp fails prematurely.

GB 1435244 discloses a lamp in which a foil is sintered as a lead-through conductor between an end of a ceramic wall of a discharge lamp and a ceramic closing disc. Although a lead-through construction highly resistant to halides is possible per se in this manner, it is necessary for such a construction to be completed during the manufacture of the lamp vessel, i.e. preceding the actual lamp manufacture during which the filling is added to the discharge vessel. This accordingly leads to a more complicated lamp manufacture, which is highly undesirable in general in a modem mass production process.

A lamp is known from U.S. Pat. No. 42,777,15 in which a closed coiled foil extends as a lead-through conductor through an end plug of a discharge vessel from the interior to outside the discharge vessel, connected thereto by means of melting glass. The foil is provided around a ceramic rod. A disadvantage of such a coiled foil is that it is found to be practically impossible to keep the foil correctly positioned during lamp manufacture, so that a non-hermetic seal is obtained at the area of the lead-through conductor.

SUMMARY OF THE INVENTION

The invention has for its object to provide a lamp of the kind mentioned in the opening paragraph which is of a simple construction and in which the risk of a premature failure owing to halide attacks is counteracted.

According to the invention, a lamp of the kind mentioned in the opening paragraph is for this purpose characterized in that the lead-through element comprises a ceramic core which is connected in a gastight manner to the ceramic plug by means of sealing ceramic in a direct joint and which is provided with metal envelopes on either side of the direct joint, which metal envelopes are interconnected by means of a strip-shaped connecting part.

An advantage of the lamp according to the invention is that the gastight closure with sealing ceramic is achieved as a direct joint between the ceramic wall and the ceramic core of the lead-through element. It is surprisingly found that the strip-shaped connecting part is entirely enveloped by the sealing ceramic while achieving a permanent adhesion and has no appreciable influence on the permanence of the lead-through construction, and thus on lamp life. A problem relating to the difference in coefficient of expansion is avoided in this manner. In a further improvement of the lamp according to the invention, the strip-shaped connecting part is provided with knife edges. This is found to promote strongly a good and permanent adhesion between the sealing ceramic and the stripshaped connecting part. In an advantageous embodiment of the lamp according to the invention, the metal envelope is fastened to the ceramic core by means of sealing ceramic outside the discharge vessel. This has the advantage that the gastight sealing ceramic closure of the discharge vessel and an adhesive joint between the ceramic core and the metal envelope can be realized in a single operational step.

In a further advantageous embodiment of the lamp, the metal envelopes are interconnected on either side of the direct joint by means of two strip-shaped connecting parts. One of the advantages of this is an improved stiffness of the assembly of the metal parts which form the envelopes and connecting strips in the finished lamp. This is of major importance for a fast and reliable mass production of the lamp. Preferably, the two strip-shaped connecting parts are positioned diametrically opposite one another. This achieves both an optimum stiffness and an equally divided load on the lead-through in the operational state of the lamp.

Preferably, the metal envelopes and their strip-shaped connecting parts are made of Mo, because this was found to be suitable as an electrical conductor as well as highly resistant to halides. In a preferred embodiment, the strip-shaped connecting parts have a joint width B of at least 0.25 O and at most 0.34 O, O being the circumference of one of the envelopes. Such a width is found to be an optimum for realizing on the one hand a good current conduction and a good stiffness of the assembly of the metal parts which form the envelopes and connecting strips in the finished lamp, and on the other hand is still small enough not to detract from the permanence of the gastight sealing of the lead-through construction. Preferably, the thickness of the envelopes and the strip-shaped connecting parts lies between 10 $\mu$m and 200 $\mu$m. Given such a choice of thickness, it was found to be possible to manufacture the entire assembly of envelopes and strip-shaped connecting parts from a pipe- or tube-shaped material, whereupon this can be passed over the ceramic core in a simple manner. A greater thickness increases the risk that the permanence of the lead-through construction becomes less reliable owing to the difference in coefficient of expansion.

For realizing a good useful life of the gastight seal, it is desirable for the sealing ceramic to extend over a length of a few mm, preferably at least 3 mm, inside the ceramic plug. It is favorable when the sealing ceramic extends to over the metal envelope present in the ceramic plug, in particular if the lamp has small dimensions.

An additional advantage of the lamp according to the invention is that the use of Nb is not necessary for current conduction outside the discharge vessel. This offers the possibility of operating the discharge vessel in the air.

The metal envelopes on either side of the direct joint may have mutually different lengths. It is favorable, however, for reasons of production efficiency if the metal envelopes have the same length.

BRIEF DESCRIPTION OF THE DRAWINGS

The above and further aspects of the invention will be explained in more detail below with reference to a drawing, in which.

DETAILED DESCRIPTION OF THE PREFERRED EMBODIMENTS

Figure 1:
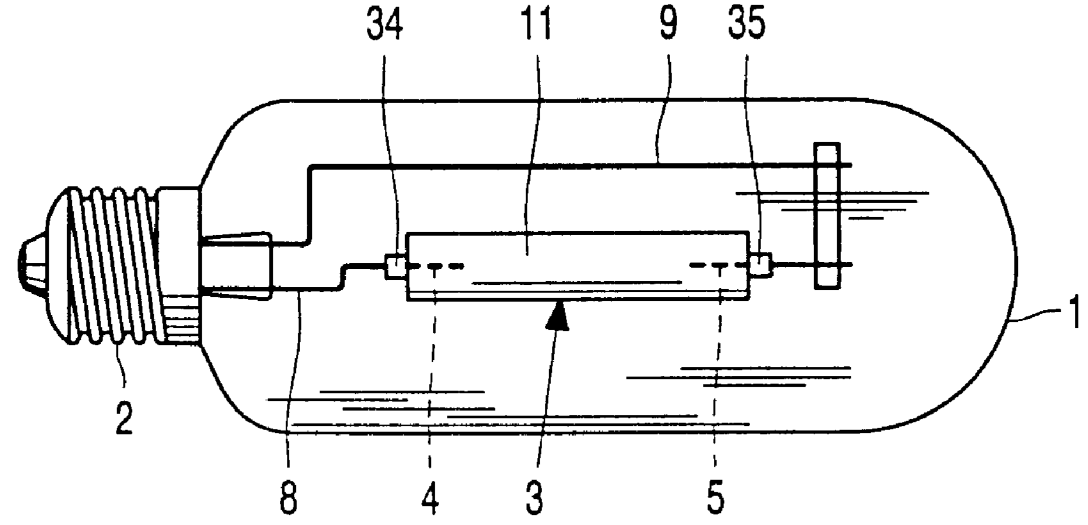
FIG. 1 is an elevation of a lamp according to the invention.
Figure 2:
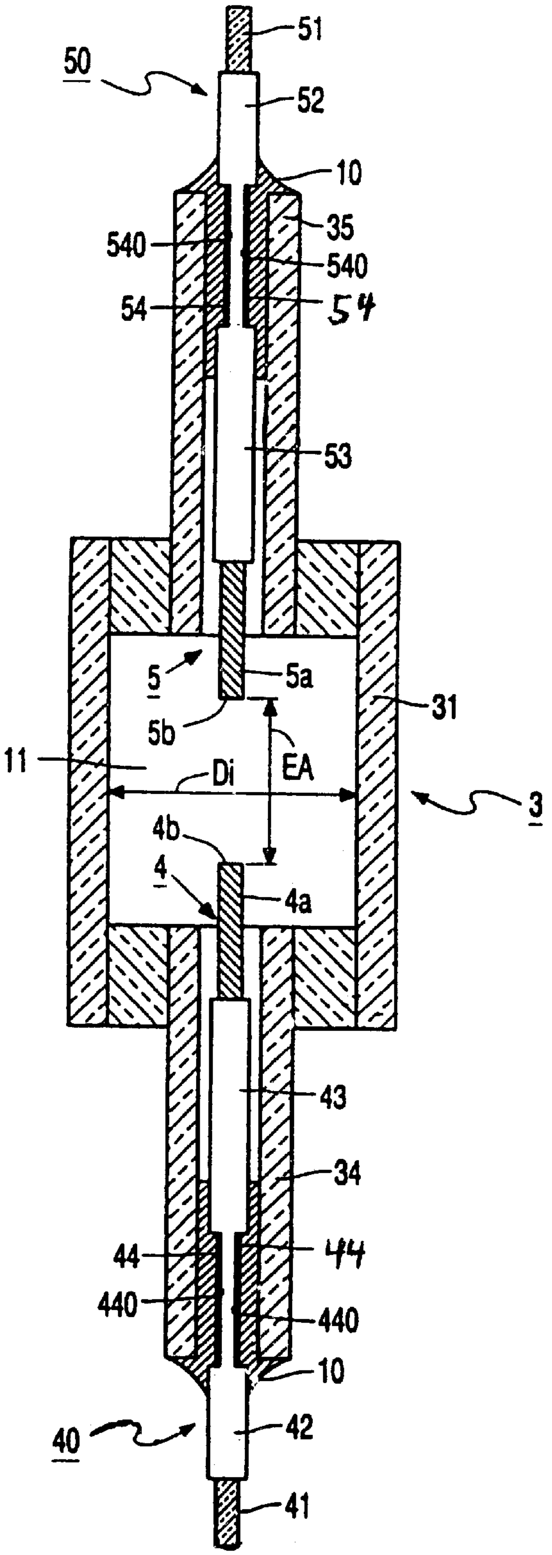
FIG. 2 is a cross-sectional view of a discharge vessel of the lamp of FIG. 1.

FIG. 1 shows a metal halide lamp provided with a discharge vessel 3, which is shown in cross-section in FIG. 2 not true to scale, with a ceramic wall 31 which encloses a discharge space 11 containing an ionizable filling, comprising Hg, a quantity of Na halide, as well as Tl, Dy, and Ce halides in the case shown. Two electrodes 4, 5, made of W in the drawing, with electrode rods 4*a*, 5*a* and electrode tips 4*b*, 5*b* with a mutual interspacing EA are arranged in the discharge space. The discharge vessel has an internal diameter Di at least over the distance EA.

The discharge vessel is closed off at one side by means of a ceramic plug in the form of a projecting plug 34, 35, in which a lead-through element 40, 50 is fastened in a gastight manner by means of a sealing ceramic 10, said element serving to provide an electrical connection between the electrode and a conductor outside the discharge vessel. The lead-through element 40, 50 comprises a ceramic core 41, 51 which is connected in a gastight manner to the ceramic plug in a direct joint by means of the sealing ceramic 10 and which is provided with respective metal envelopes 42, 43 and 52, 53 on either side of the direct joint, which metal envelopes are interconnected by means of respective strip-shaped connecting parts 44 and 54. The metal envelope 42, 52 outside the discharge vessel is fastened to the ceramic core 41, 51 by means of the sealing ceramic 10. The strip-shaped connecting part 44, 54 is provided with knife edges 440, 540. The electrode rod 4*a*, 5*a* is connected to the metal envelope 43, 53 inside the discharge vessel with electrical conduction, for example by means of a spot weld.

The sealing ceramic extends over a length of approximately 4 mm inside the ceramic plug to over the metal envelope 43, 53 which is present in the ceramic plug.

The discharge vessel is surrounded by an outer bulb 1 which is provided with a lamp cap 2 at an end. A discharge extends between the electrodes 4 and 5 in the operational state of the lamp. The electrode 4 is connected to a first electrical contact which forms part of the lamp cap 2 via a current conductor 8. The electrode 5 is connected to a second electrical contact which forms part of the lamp cap 2 via a current conductor 9.

In a practical realization of the lamp described, the lamp is of the CDM 70 type with a power rating of 70 W. The discharge vessel is closed off at both ends by means of a ceramic plug having an internal diameter of 780 μm. The lead-through element which is fastened in a direct joint in the plug by means of sealing ceramic comprises a ceramic core of $Al_2O_3$ with a diameter of 450 μm which is provided with an Mo envelope at either end. The Mo envelope has an external diameter of 720 μm. The two envelopes are interconnected by two Mo strips. Each strip has a width of 340 μm, which means that in total for both strips this accounts for approximately ⅓of the circumference of the envelopes. The envelope outside the discharge vessel and the one present in the ceramic plug each have a length of 7 mm. The thickness of the strips and of the two envelopes is 110 μm, their length is 5 mm.

The lamp described was switched off for inspection purposes after it had reached a life of 6000 hours of operation. The inspection showed that the sealing ceramic was slightly attacked at its surface facing the discharge space, but only such that the entirety of the lead-through element, the ceramic plug and the gastight interconnection was intact.

What is claimed is:

1. A metal halide lamp, comprising:

a discharge vessel with a ceramic wall which encloses a discharge space in which an electrode is arranged, which discharge vessel is sealed off by a ceramic plug in which a lead-through element is fastened in a gastight manner by a sealing ceramic, said lead-through element serving to form an electrical connection between said electrode and a conductor outside said discharge vessel, wherein said lead-through element includes a ceramic core which is connected in a gastight manner to said ceramic plug by sealing ceramic in a direct joint and which is provided with metal envelopes on either side of said direct joint, which metal envelopes are interconnected by a strip-shaped connecting part.

2. The lamp as claimed in claim 1, wherein the strip-shaped connecting part is provided with knife edges.

3. The lamp as claimed in claim 1, wherein the metal envelope is fastened to the ceramic core by means of sealing ceramic outside the discharge vessel.

4. The lamp as claimed in claim 1, wherein the metal envelopes are interconnected on either side of the direct joint by means of two strip-shaped connecting parts.

5. The lamp as claimed in claim 4, wherein two strip-shaped connecting parts are positioned diametrically opposite one another.

6. A discharge vessel employed in a metal halide lamp, said discharge vessel comprising:

a ceramic wall defining a discharge space;

ceramic plug connected to one end of said ceramic wall;

a ceramic core disposed within said ceraimic plug, said ceramic core including a first metal envelope connected to an electrode arranged in the discharge space; and a sealing ceramic connecting said first metal envelope to said ceramic plug in a gastight manner.

7. The discharge vessel of claim 6, wherein said sealing ceramic extends along at least portion of said first metal envelope.

8. The discharge vessel of claim 6, wherein said ceramic core further includes a second metal envelope connected to a conductor arranged outside of the discharge space.

9. The discharge vessel of claim 8, wherein said sealing ceramic connects said second metal envelope to said ceramic plug in the gastight manner.

10. The discharge vessel of claim 9, wherein said sealing ceramic extends along at least a portion of said second metal envelope.

11. The discharge vessel of claim 8, wherein said ceramic core further includes at least one strip-shaped connection part interconnecting said first metal envelope and said second metal envelope.

12. The discharge vessel of claim 11, wherein said sealing ceramic connects said at least one strip-shaped connection part to said ceramic plug in the gastight manner.

13. The discharge vessel of claim 11, wherein said sealing ceramic extends along at least a portion of said at least one strip-shaped connection part.

14. A discharge vessel employed in a metal halide lamp, said discharge vessel comprising:

a ceramic wall defining a discharge space;

a ceramic plug connected to one end of said ceramic wall; and a ceramic core connected to said ceramic plug, said ceramic core including an interconnection of a first metal envelope and a second metal envelope, said first metal envelope further connected to an electrode arranged in the discharge space, said second metal envelope further connected to a conductor arranged outside of the discharge space, and a sealing ceramic connecting said ceramic core to said ceramic plug in a gastight manner.

15. The discharge vessel of claim 14, wherein said ceramic core further includes a direct joint physically adjoined to said first metal envelope and said second metal envelope.

16. The discharge vessel of claim 15, wherein said sealing ceramic extends along at least a portion of said direct joint.

* * * * *